United States Patent
Lee et al.

(10) Patent No.: US 7,456,053 B2
(45) Date of Patent: Nov. 25, 2008

(54) PACKAGING METHOD FOR SEGREGATING DIE PADDLES OF A LEADFRAME

(75) Inventors: Yonggill Lee, Kaoshiung (TW); Kwangwon Koh, Kaoshiung (TW); Sangyun Lee, Kaoshiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 107 days.

(21) Appl. No.: 11/357,952

(22) Filed: Feb. 22, 2006

(65) Prior Publication Data

US 2007/0020802 A1 Jan. 25, 2007

(30) Foreign Application Priority Data

Jul. 14, 2005 (TW) .............................. 94123931 A

(51) Int. Cl.
*H01L 21/48* (2006.01)

(52) U.S. Cl. ............................... 438/124; 257/E21.499

(58) Field of Classification Search ......... 438/106–112, 438/118, 123–124, 456, 660, 689–690, 674, 438/613; 257/666, 676, 692, 827; 216/13; 29/827

See application file for complete search history.

(56) References Cited

U.S. PATENT DOCUMENTS

| | | | | |
|---|---|---|---|---|
| 6,380,048 B1 * | 4/2002 | Boon et al. | .................. | 438/456 |
| 6,498,099 B1 * | 12/2002 | McLellan et al. | ........... | 438/689 |
| 7,247,526 B1 * | 7/2007 | Fan et al. | ..................... | 438/123 |

* cited by examiner

*Primary Examiner*—Scott B. Geyer
*Assistant Examiner*—Andre' Stevenson
(74) *Attorney, Agent, or Firm*—Volentine & Whitt, P.L.L.C.

(57) ABSTRACT

A packaging method for segregating die paddles of a leadframe, includes (a) providing a leadframe having a top surface, a bottom surface and a die paddle region, the die paddle region having a plurality of die paddles, wherein at least two of the die paddles are connected to each other by at least one connecting bar; (b) attaching a plurality of dies onto the die paddles; (c) forming a molding compound to encapsulate the dies on the die paddles, and exposing the bottom surface of the connecting bar outside the molding compound; and (d) removing part of the connecting bar so as to segregate the die paddles. The die paddles are thus rendered stable during the steps of die attaching, wire bonding and molding, and the yield is raised.

20 Claims, 17 Drawing Sheets

US 7,456,053 B2

PACKAGING METHOD FOR SEGREGATING DIE PADDLES OF A LEADFRAME

BACKGROUND OF THE INVENTION

1. Field of the invention

The present invention relates to a packaging method, particularly for segregating die paddles of a leadframe.

2. Description of the Related Art

FIG. 1 shows a top view of the die paddles region of a leadframe before molding. The die paddles region 1 of the leadframe comprises a first die paddle 11, a second die paddle 12 and a third die paddle 13 so as to carry dice 14, 15, 16 respectively, wherein each of the die paddles 11, 12, 13 is segregated from the others. In addition, the die paddles 11, 12, 13 and the dice 14, 15, 16 are electrically connected by a plurality of conducting wires 18.

Since the left end of the third die paddle 13 is a free end, the third paddle 13 is unstable during the steps of die attaching, bonding and molding, such as shaking problem, to cause a failure of packaging. In order to improve the shortcoming, the stability of the third die paddle 13 in prior art is increased by using a connecting bar 17 to link the left end of the third die paddle 13 to the left end of the die paddle region 1. However, the connecting bar 17 is so long that a weak point is formed at the connecting region between the right end of the connecting bar 17 and the third die paddle 13. The weak point probably sways and bends, even cracks and thus causes defects of products. Besides, the connecting bar 17 decreases the usage area of surface of the die paddle region 1.

Consequently, there is an existing need for a packaging method to solve the above-mentioned problems.

SUMMARY OF THE INVENTION

One objective of the present invention is to provide a packaging method. Firstly, a plurality of die paddles are connected to each other by connecting bars. Afterwards, the connecting bars are cut or removed after die attaching, bonding and molding method. Whereby, the die paddles are stable during the steps of die attaching, wire bonding and molding, and the yield is raised.

Another objective of the present invention is to provide a packaging method that reduces the area of the surface of connecting bars and increases the usage area of die paddle region by using the connecting bars to connect the die paddle.

Still another objective of the present invention is to provide a packaging method for segregating die paddles of a leadframe. The packaging method of the invention comprises the steps of:

(a) providing a leadframe having a top surface, a bottom surface and a die paddle region, the die paddle region having a plurality of die paddles, at least two die paddles connected to each other by a connecting bar;

(b) attaching a plurality of dies onto the die paddles;

(c) forming a molding compound to encapsulate the dies on the die paddles and to expose a bottom surface of the connecting bar outside the molding compound; and (d) removing part of the connecting bar so as to segregate the connected die paddles.

DETAILED DESCRIPTION OF THE INVENTION

Figure 1:
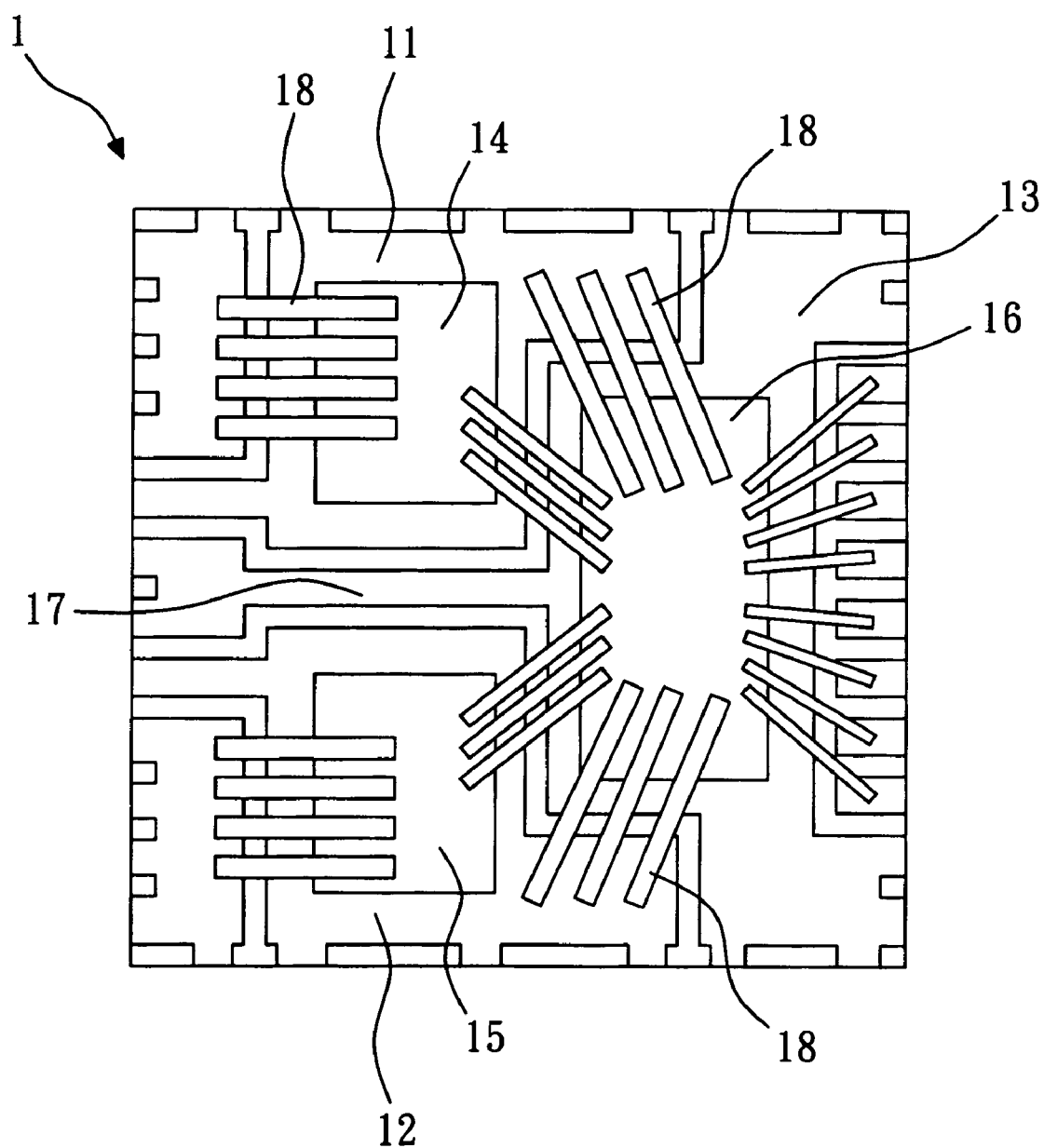
FIG. 1 shows a top view of the die paddles region of a conventional leadframe before a molding step.
Figure 2:
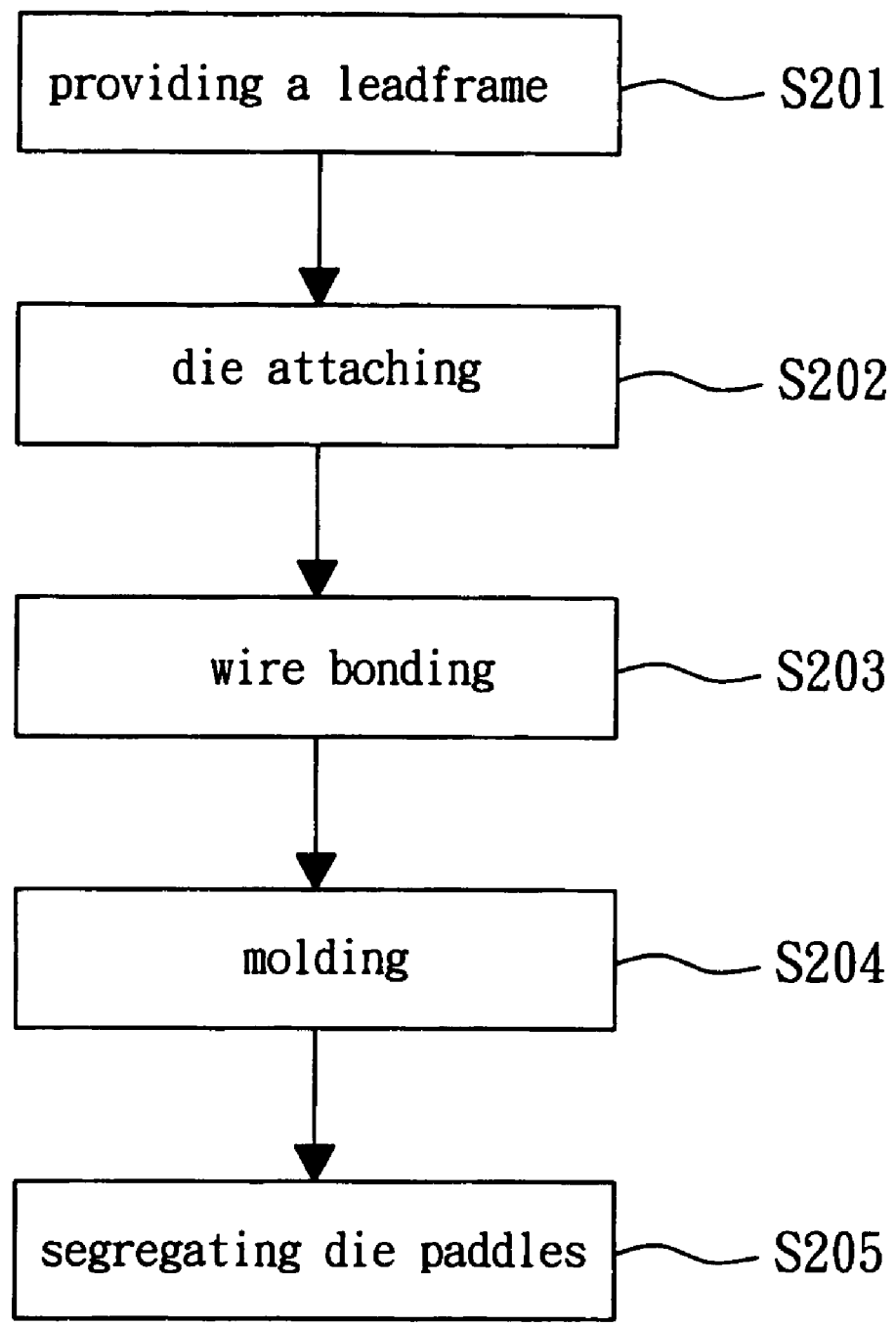
FIG. 2 shows flow chart of the packaging method for segregating die paddles of a leadframe according to a first embodiment of the present invention.
Figure 3:
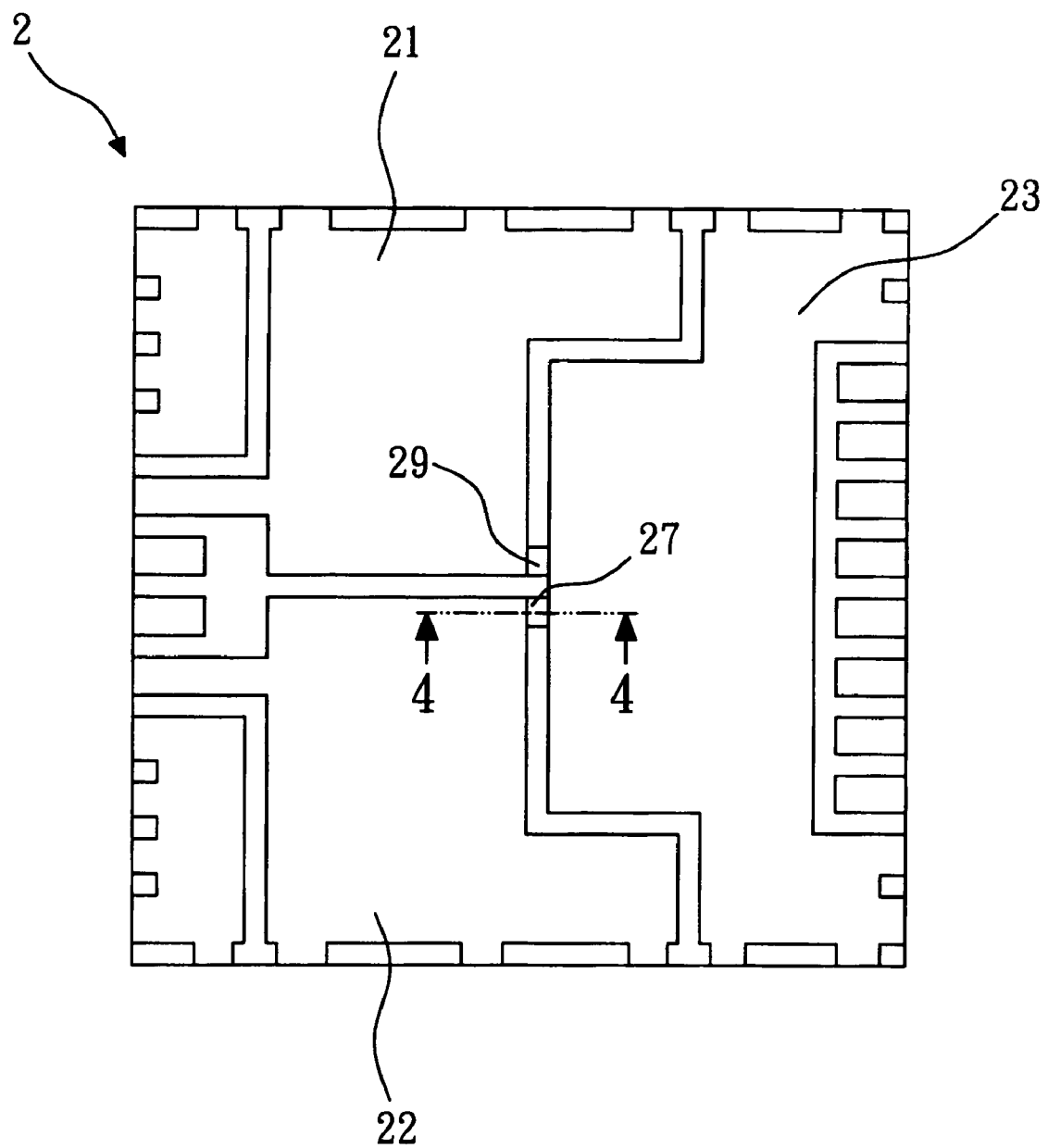
FIG. 3 shows a top view of die paddle region of the leadframe according to the first embodiment of the present invention.
Figure 4:
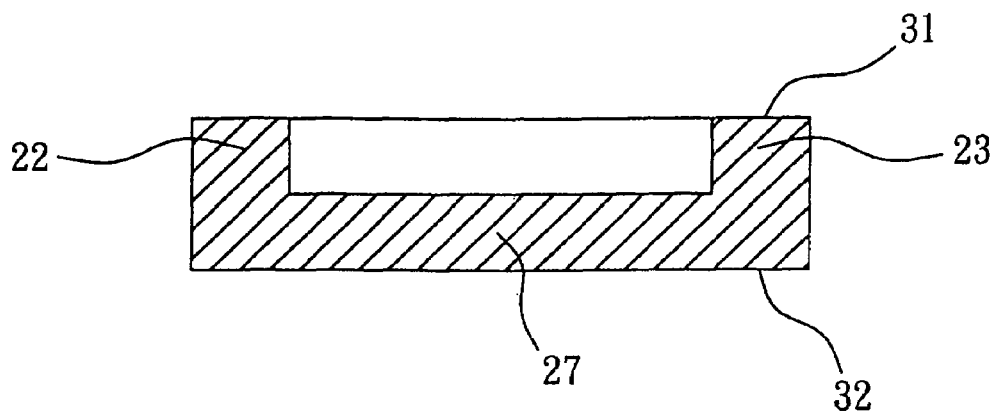
FIG. 4 shows a partial sectional view along line 4-4 of the FIG. 3.
Figure 7:
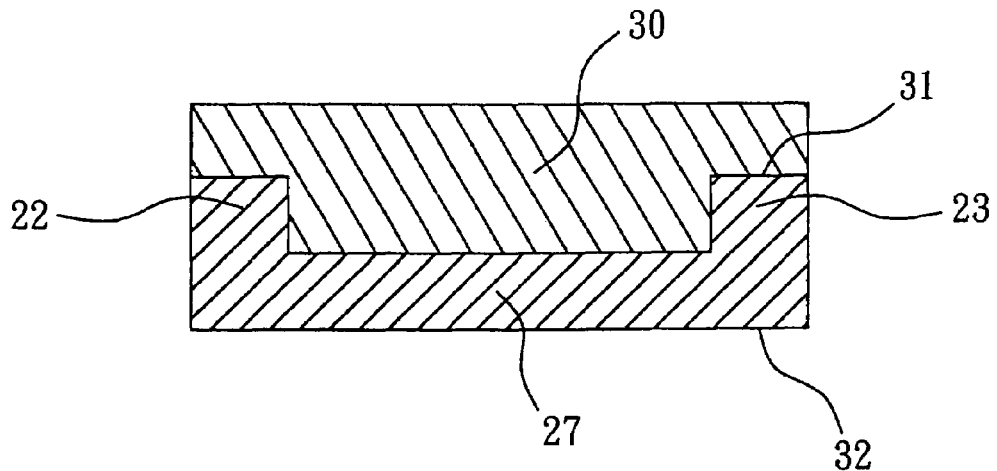
FIG. 7 shows the molding step according to the first embodiment of the present invention.

FIG. 2 shows flow chart of the packaging method for segregating die paddles of a leadframe according to a first embodiment of the present invention. FIG. 3 shows a top view of die paddle region of the leadframe according to the first embodiment of the present invention. FIG. 4 shows a sectional view of the FIG. 3 along line 4-4 according to the present invention. The packaging method of the present invention comprises the following steps. Firstly, referring to FIG. 3 and FIG. 4, as shown in step S201 of FIG. 2, a leadframe is provided. The leadframe comprises a top surface 31, a bottom surface 32 and a die paddle region 2. The die paddle region 2 has a first die paddle 21, a second die paddle 22 and a third die paddle 23. The second die paddle 22 and the third die paddle 23 connect to each other by a connecting bar 27. The first die paddle 21 and the third die paddle 23 connect to each other by a connecting bar 29. Except the connecting bars 27, 29, the first die paddle 21, the second die paddle 22 and the third die paddle 23 do not connect to each other. It should be noted in the embodiment that the die paddle region 2 has three die paddles, but the die paddle region of the invention may not be limited to have three die paddles. The die paddle region also can have two, four, five, six or more die paddles.

The left side of the third die paddle 23 connects to the first die paddle 21 and the second die paddle 22 by using the connecting bars 27, 29, respectively. Therefore, the left side of the third die paddle 23 is not a free end, and it will be stable in the following processes. Compared with the conventional connecting bar 17, the present invention is better for fastening the third die paddle 23. In addition, the present invention omits the conventional connecting bar 17 so as to increase the areas of the first die paddle 21 and the second die paddle 22.

In the embodiment, because the connecting bars 27, 29 are finally cut off, the thickness of the connecting bars 27, 29 are designed to be thinner than that of the die paddles 22, 23, as shown in FIG. 4, so as to facilitate the following step of cutting. In the embodiment, the left side of the third die paddle 23 connects to the first die paddle 21 and the second die paddle 22 by using the connecting bars 27, 29, respectively; however, it is understood that the third die paddle 23 can only connect to the first die paddle 21 or only connect to the second die paddle 22. In addition, the third die paddle 23 can also connect to the first die paddle 21 by using a plurality of connecting bars.

Figure 5:
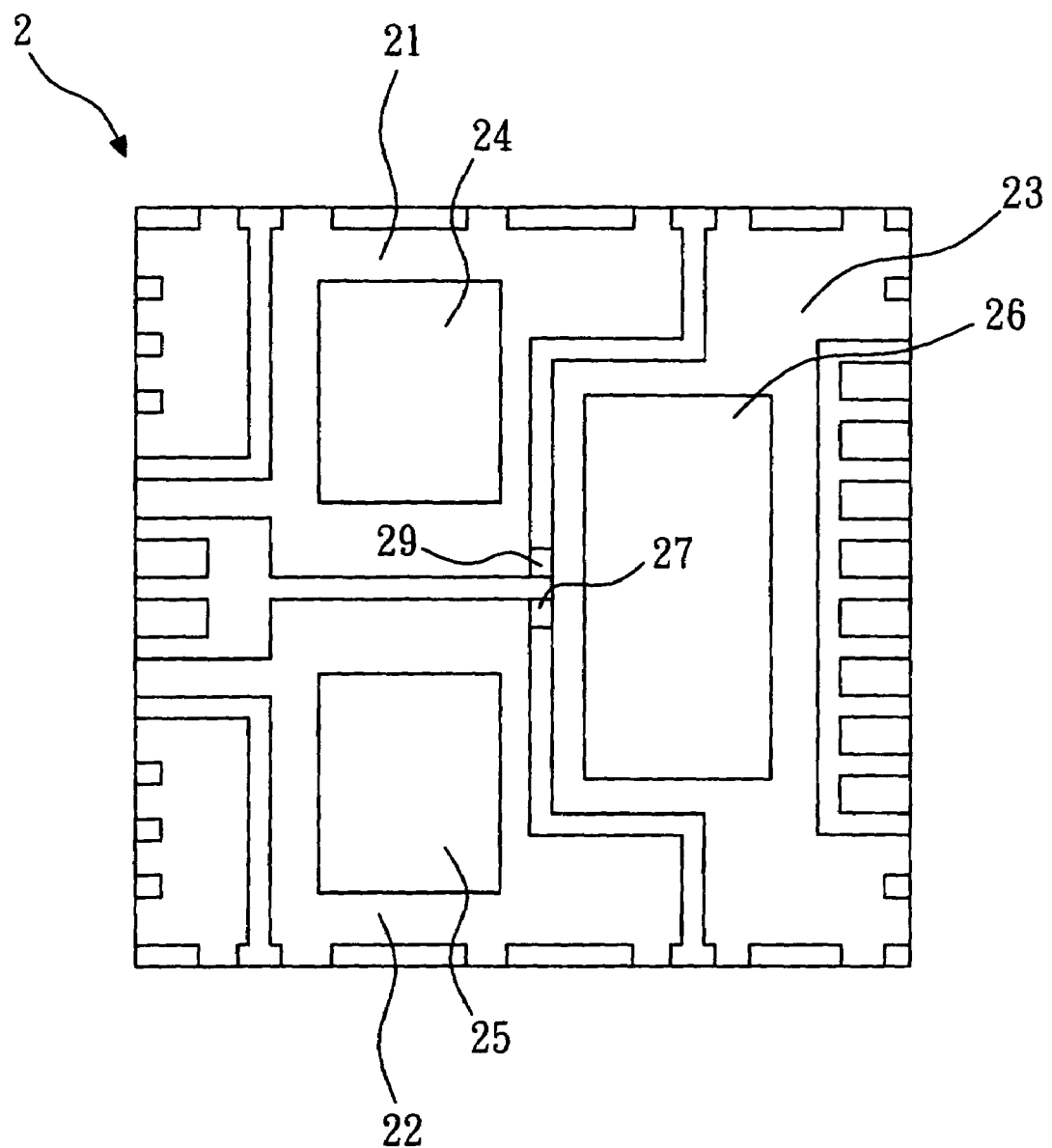
FIG. 5 shows a top view of the die paddle region after the die attaching step according to the first embodiment of the present invention.

Referring to FIG. 5, the step S202 in FIG. 2 is a die attaching step. A plurality of dice 24, 25, 26 are attached onto the die paddles 21, 22, 23.

Figure 6:
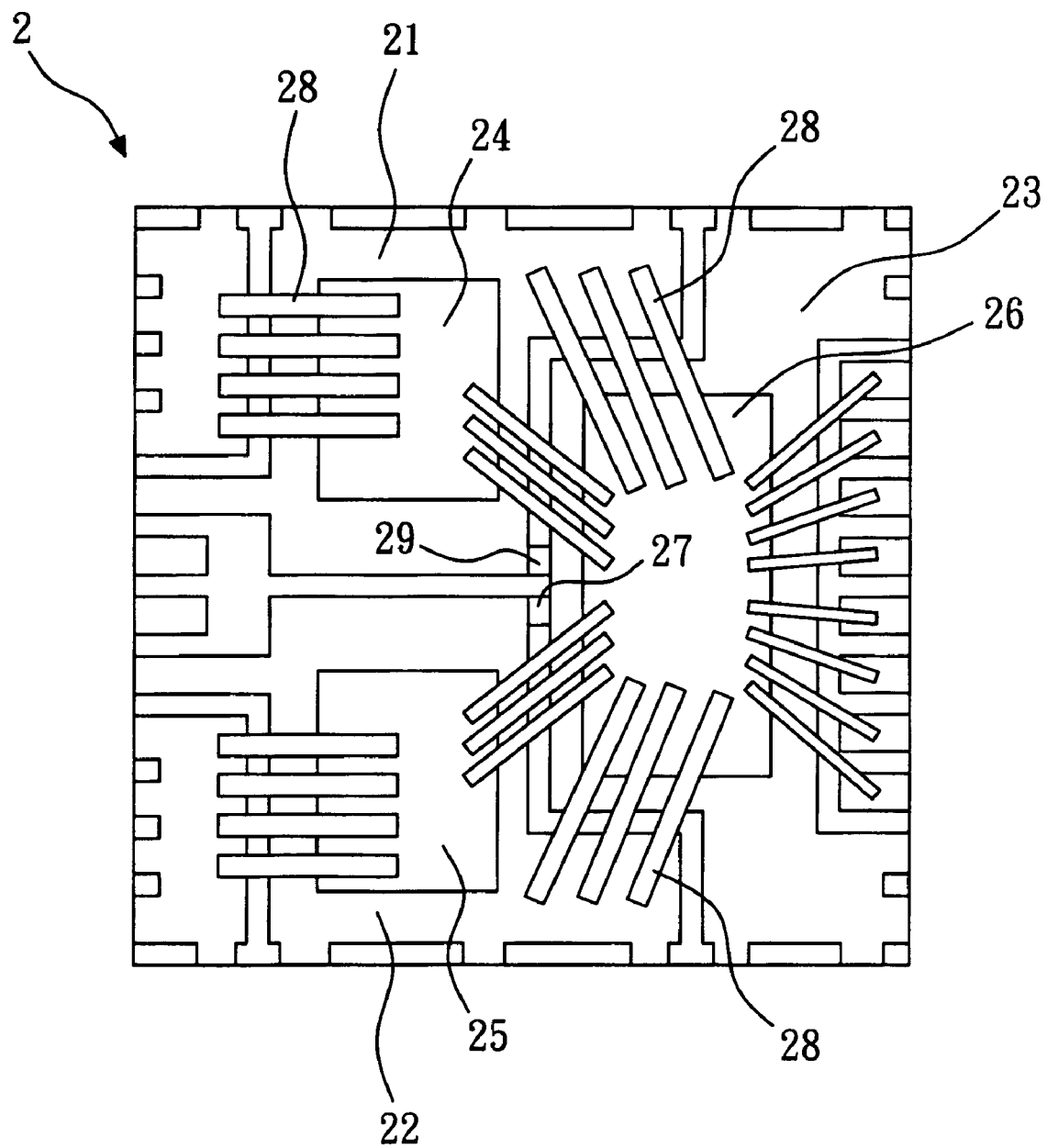
FIG. 6 shows a top view of the die paddle region after the bonding step according to the first embodiment of the present invention.

Referring to FIG. 6, the step S203 in FIG. 2 is a bonding step. A plurality of conducting wires 28 are formed to electrically connect the dice 24, 25, 26 and the die paddles 21, 22, 23 or somewhere that should be electrically connected. It is to be understood that the step S203 is not necessary; in other words, the step S203 is an optional step.

Referring to FIG. 6, the step S204 in FIG. 2 is a molding step. A molding compound 30 is formed to encapsulating the dies 24, 25, 26 on the die paddles 21, 22, 23, and the bottom surface of the connecting bar 27 is exposed outside the molding compound 30.

Figure 8:
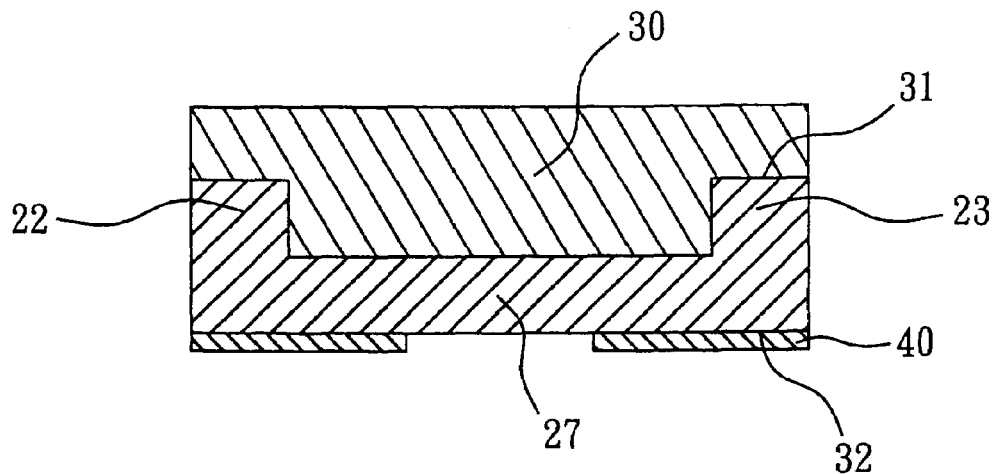
FIGS. 8 to 11 show the segregating step according to the first embodiment of the present invention.
Figure 9:
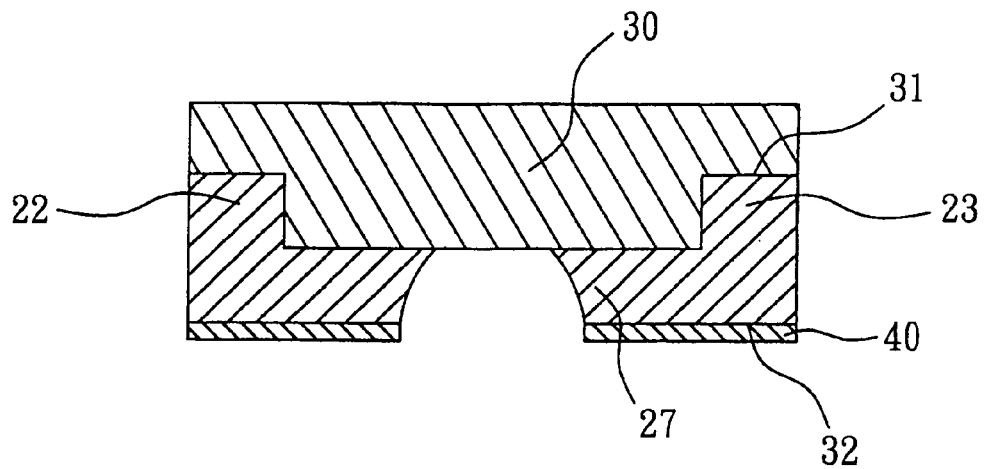
Figure 10:
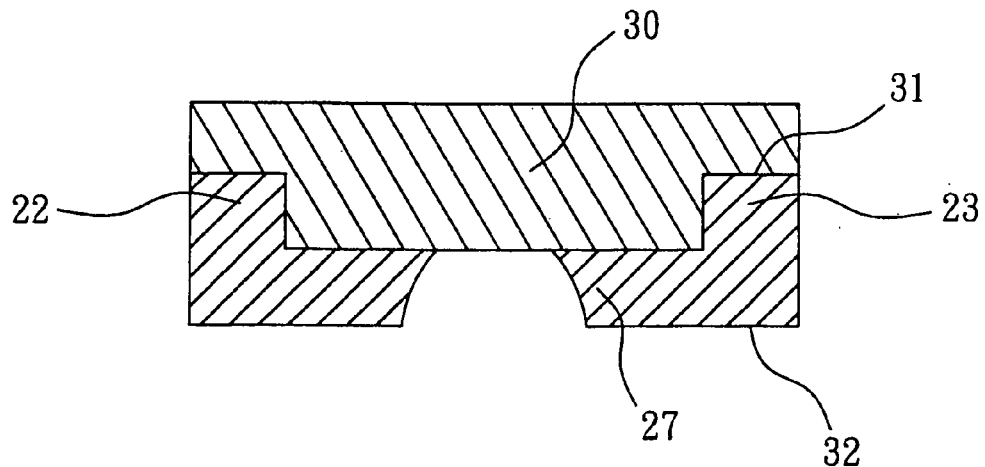
Figure 11:
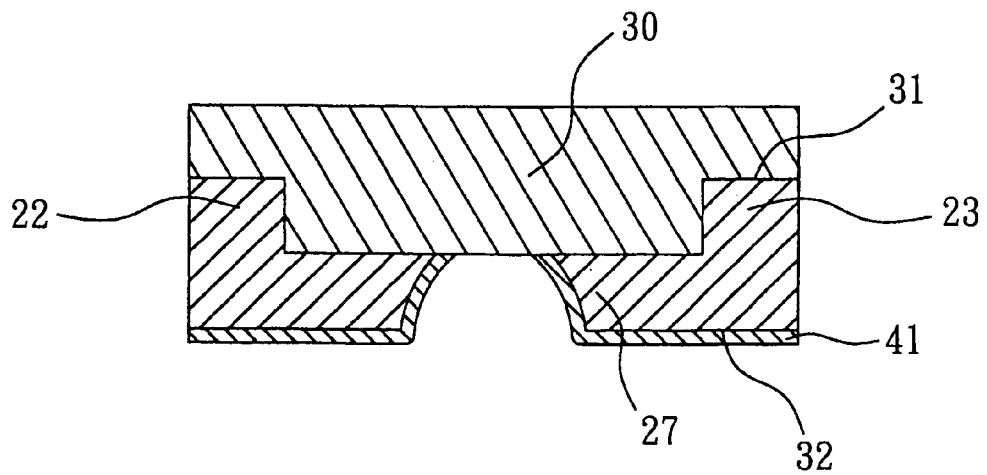

Finally, the step S205 in FIG. 2 is a segregating step. Part of the connecting bar 27 is removed to segregate the die paddles 21, 22, 23. Perfectly, the connecting bar 27 is totally removed. In the embodiment, the connecting bar 27 is cut off at the bottom surface by etching method. It is noted that the connecting bar 27 can also be cut off in another method. The etching method of the embodiment is described as follows. Firstly, referring to FIG. 8, a photo resist layer 40 is formed under the connecting bar 27, wherein the photo resist layer 40 does not fully cover the bottom surface of the connecting bar 27 so as to expose part of the connecting bar 27. Referring to FIG. 9, the exposed part of the connecting bar 27 is etched so as to completely cut off the connecting bar 27. Referring to FIG. 10, the photo resist layer 40 is removed. Finally, the bottom surface of the connecting bar 27 is plated to form a plating layer 41, as shown in FIG. 11, and the segregating steps are therefore performed.

Figure 12:
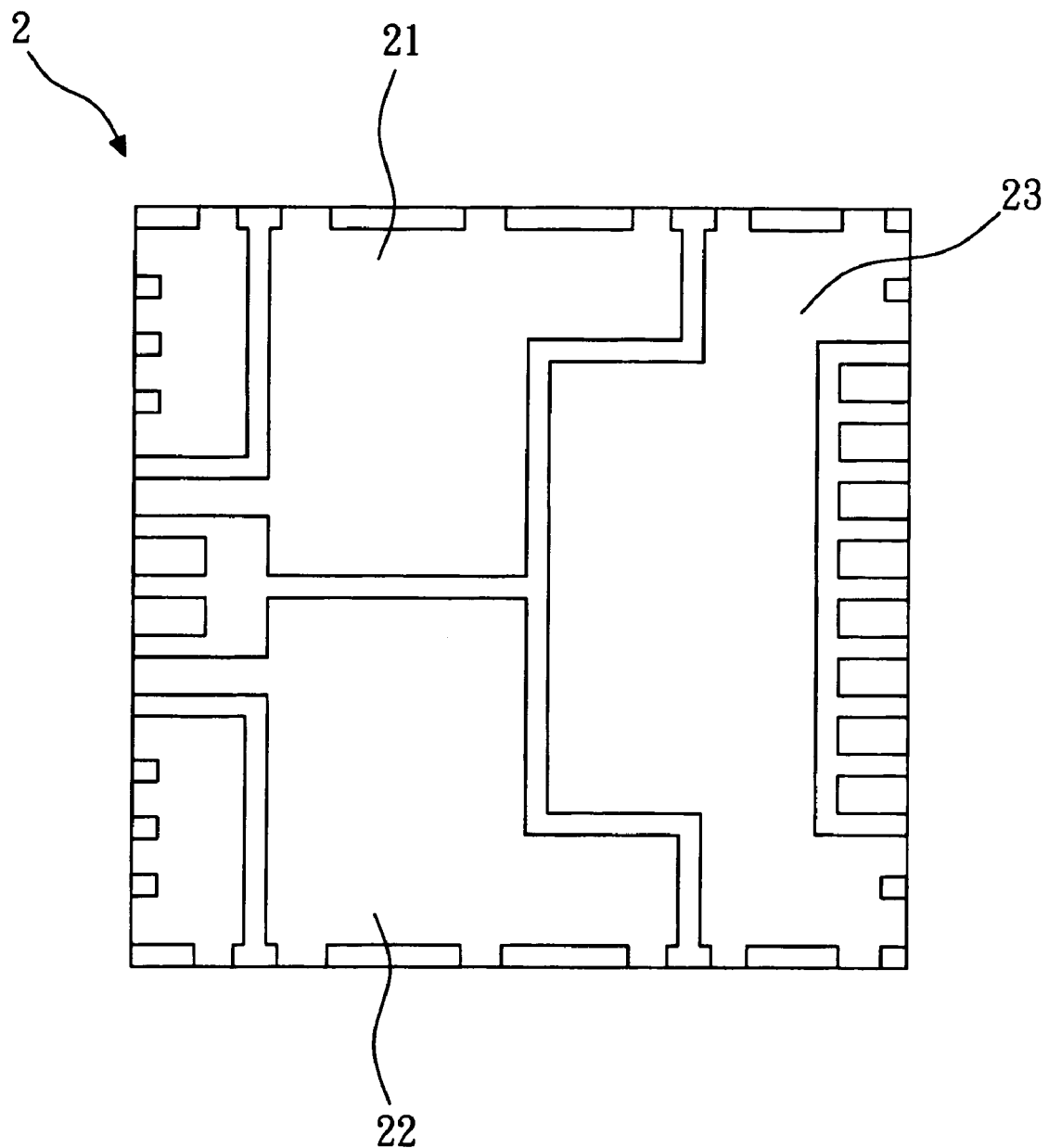
FIG. 12 shows a bottom view of the die paddle region of the first embodiment by omitting the compound after the molding step according to the first embodiment of the present invention.

FIG. 12 shows a bottom view of the die paddle region without the compound after the molding step according to the first embodiment of the present invention. It can be observed that the connecting bars 27, 29 (as shown in FIG. 3) are totally removed. In the die paddle region 2, the die paddles 21, 22, 23 have already been segregated and are disconnected from each other.

Figure 13:
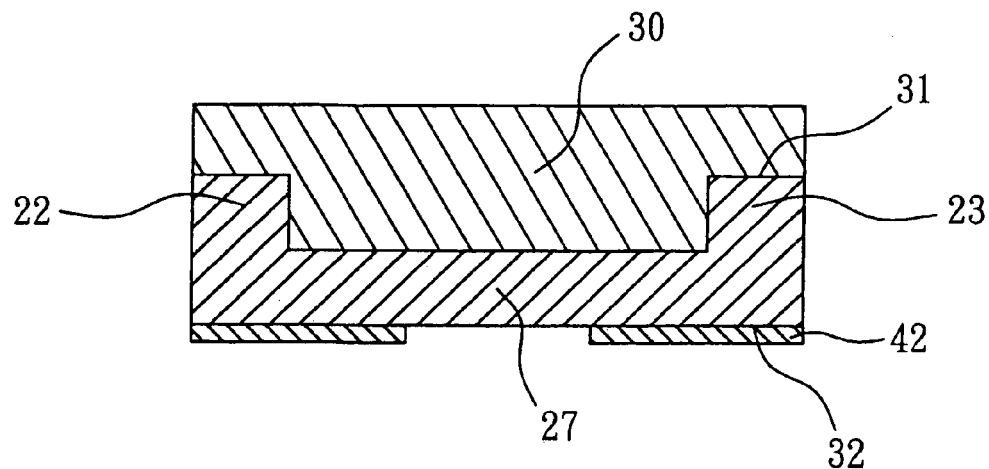
FIGS. 13 to 15 show the segregating step according to a second embodiment of the present invention.
Figure 14:
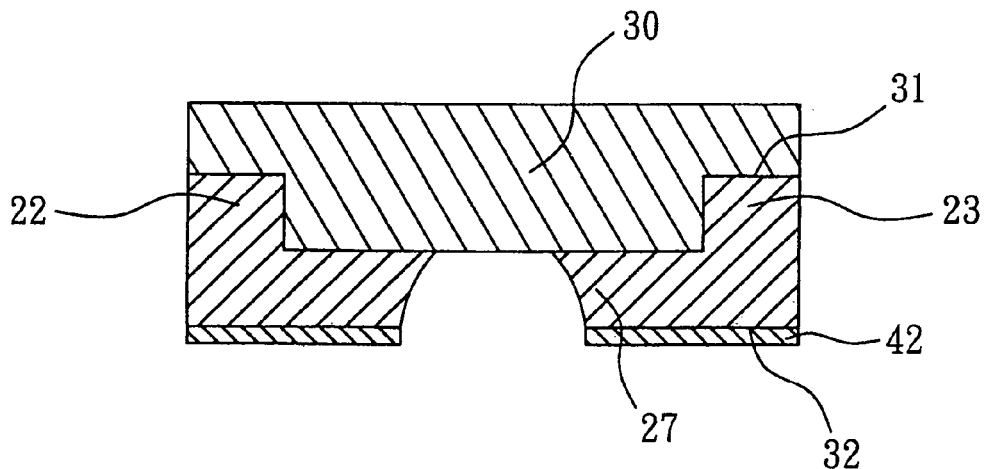
Figure 15:
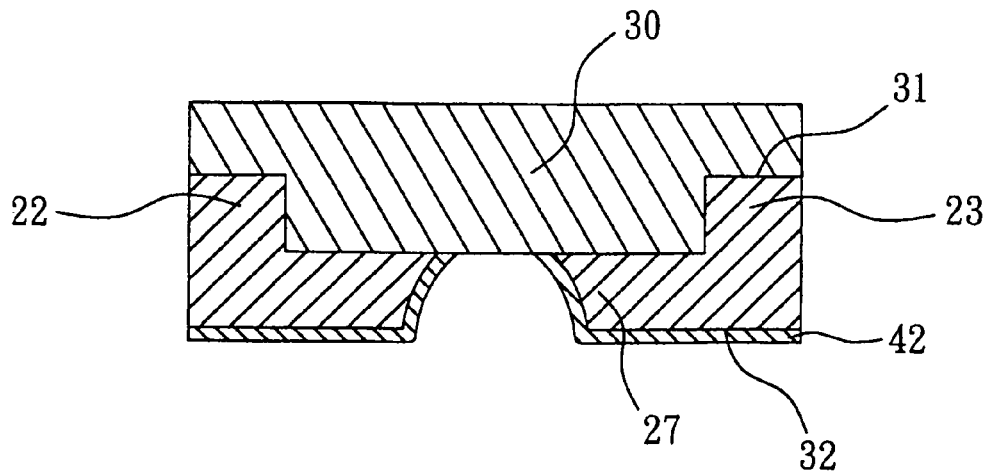

FIGS. 13 to 15 show the segregating step according to a second embodiment of the present invention. In the embodiment, the steps of providing a leadframe, die attaching, bonding and molding are the same as those of the first embodiment, however, there is difference in the segregating step. In the embodiment, the connecting bar 27 is the same cut off at the bottom surface by etching method. The etching method of the embodiment is described as follows. Firstly, referring to FIG. 13, the bottom surface of the connecting bar 27 is plated to form a plating layer 42, wherein the plating layer 42 does not fully cover the bottom surface of the connecting bar 27 so as to expose part of the connecting bar 27. It is to be understood that the plating step may be performed after the step S201 in FIG. 2, i.e. the bottom surface of the leadframe has a plating layer 42 in the beginning. Referring to FIG. 14, the exposed part of the connecting bar 27 is etched so as to completely cut off the connecting bar 27 to form a cavity. It is to be noted that the etching step must be performed after the molding step. Finally, the cavity of the bottom surface of the connecting bar 27 is plated, shown in FIG. 15, and the segregating step is therefore performed.

Figure 16:
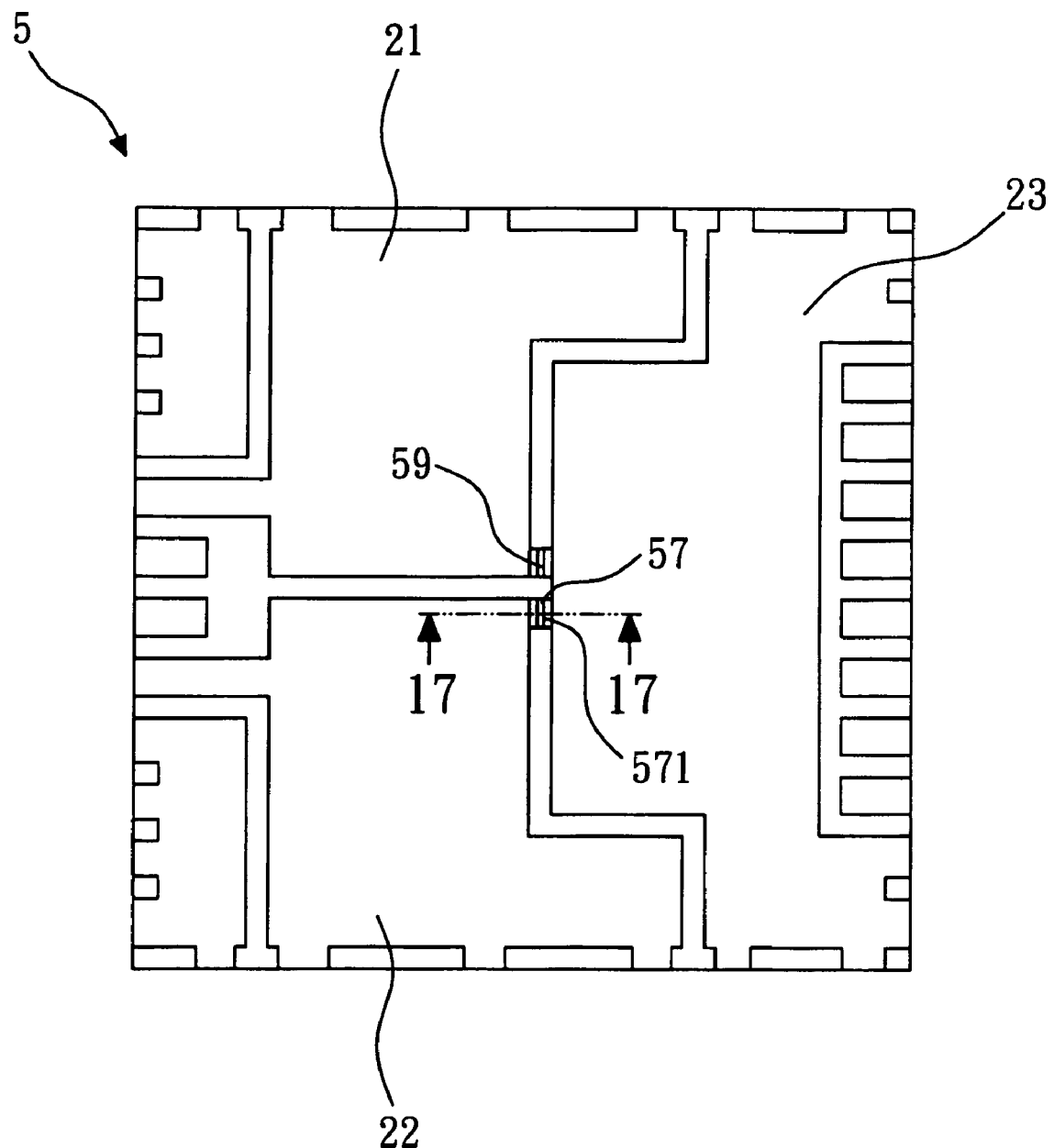
FIG. 16 shows a top view of die paddles of the leadframe according to a third embodiment of the present invention.
Figure 17:
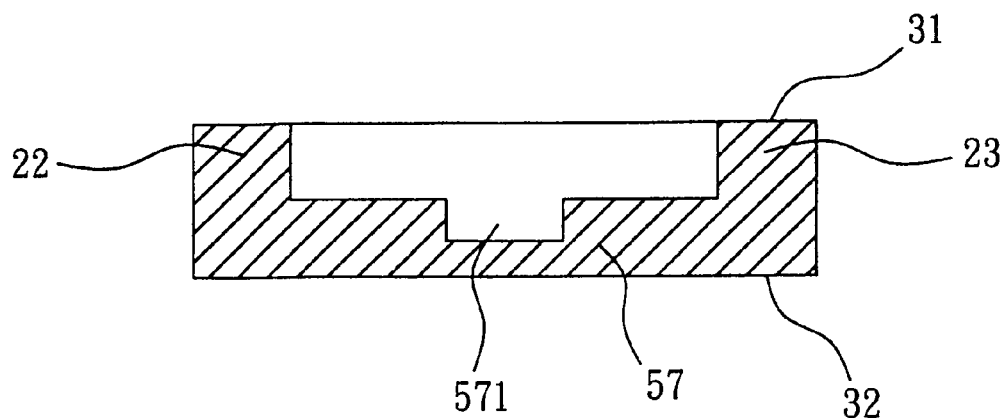
FIG. 17 shows a partial sectional view of die paddle region of the leadframe according to the third embodiment of the present invention.
Figure 18:
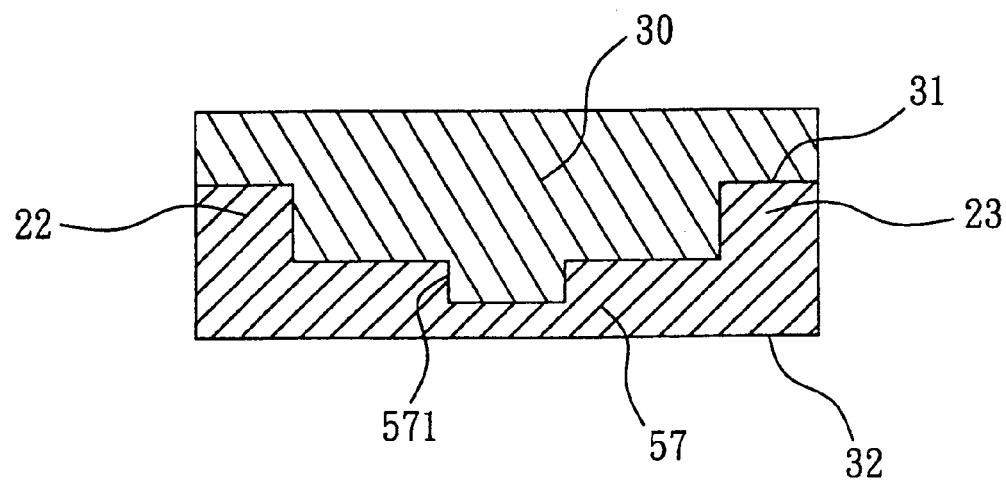
FIG. 18 shows the molding step according to the third embodiment of the present invention.

Referring to FIG. 16 and FIG. 17, they show a top view and a sectional view of die paddle region of the leadframe respectively according to a third embodiment of the present invention. The difference between the leadframe of the third embodiment and the leadframe of the first embodiment is the type of the connecting bars 57, 59 in the die paddle region. In the embodiment, taking the connecting bar 57 for an example, at least one top cavity 571 is preformed on the top surface of the connecting bar 57 because the connecting bar 57 is to be finally cut off, i.e. the top surface of the connecting bar 57 have already had the top cavity 571 in the step S201 in FIG. 2. The die attaching step and the bonding step are the same as those of the first embodiment. Afterwards, the step S204 is a molding step. The molding step utilizes a molding compound 30 to encapsulate the dice 24, 25, 26 on surfaces of the die paddles 21, 22, 23, and the bottom surface of the connecting bar 57 is exposed outside the molding compound 30, as shown in FIG. 18. Furthermore, the top cavity 571 is filled up with the molding compound 30.

Figure 19:
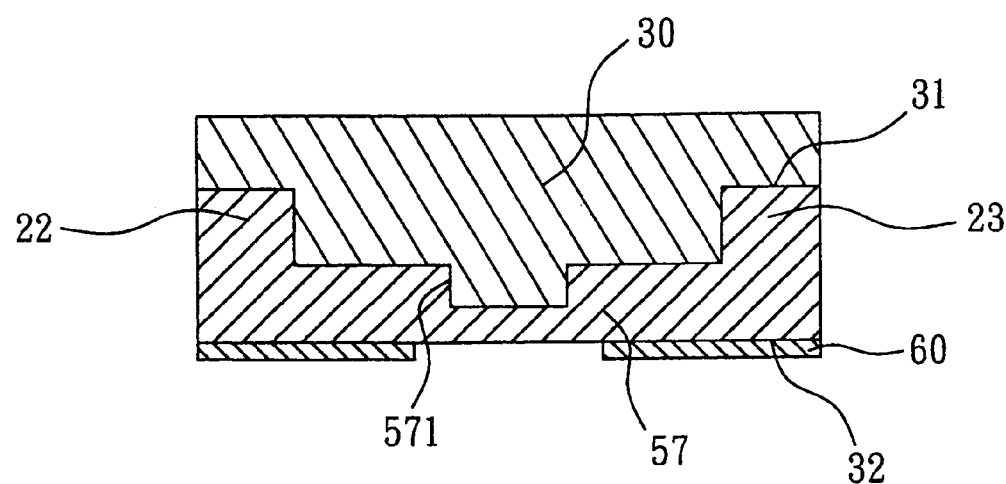
FIGS. 19 to 22 show the segregating step according to the third embodiment of the present invention.
Figure 20:
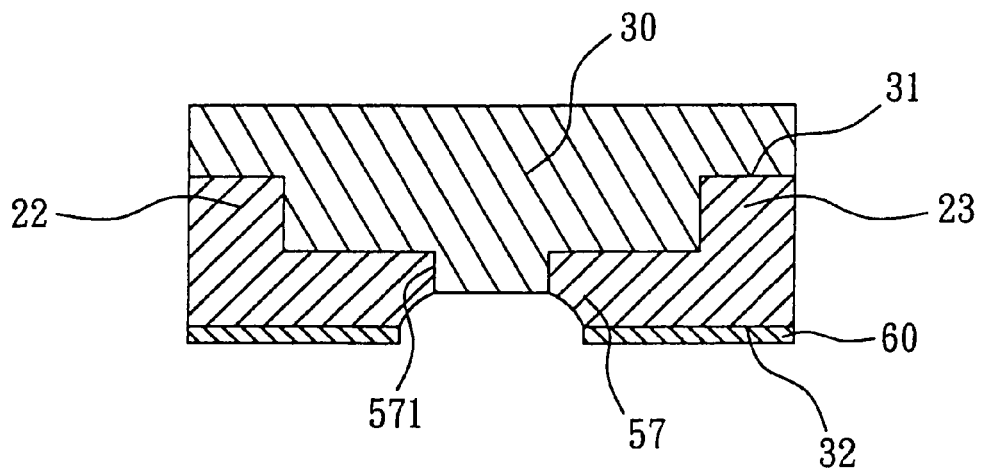
Figure 21:
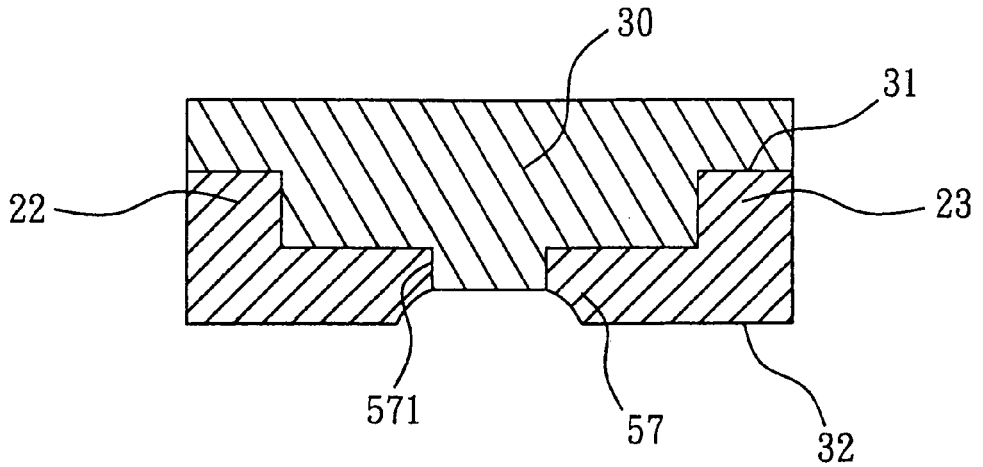
Figure 22:
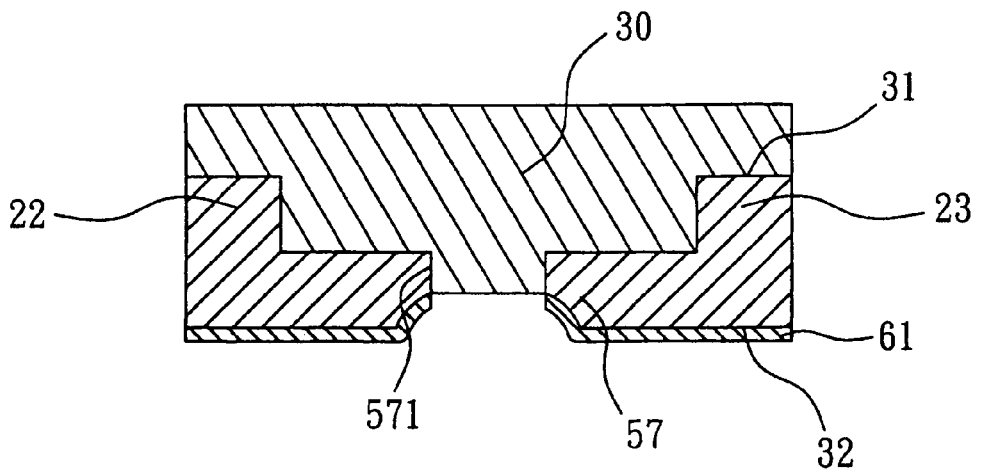
Figure 23:
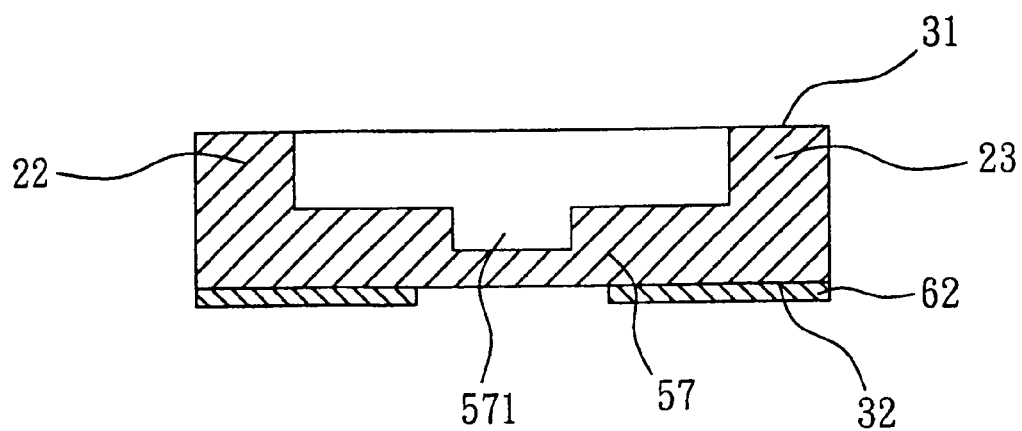
FIGS. 23 to 26 show the segregating step according to a fourth embodiment of the present invention.

Finally, the step S205 in FIG. 2 is a segregating step. In the segregating step, part of the connecting bar 57 is removed so as to segregate the die paddles 21, 22, 23. Perfectly, the connecting bar 57 is to be totally removed. In the embodiment, the connecting bar 57 is to be cut off at the bottom surface of the connecting bar 57 by etching method. The etching method of the embodiment is described as follows. Firstly, referring to FIG. 19, a photo resist layer 60 is formed on the bottom surface of the connecting bar 57, wherein the photo resist layer 60 does not fully cover the bottom surface of the connecting bar 57 so as to expose part of the connecting bar 57. Referring to FIG. 20, the part of the connecting bar 57 is etched to be completely cut off. Referring to FIG. 21, the photo resist layer 60 is removed. Finally, the bottom surface of the connecting bar 57 is plated to form a plating layer 61, as shown in FIG. 22, and the segregating step is therefore performed.

Figure 24:
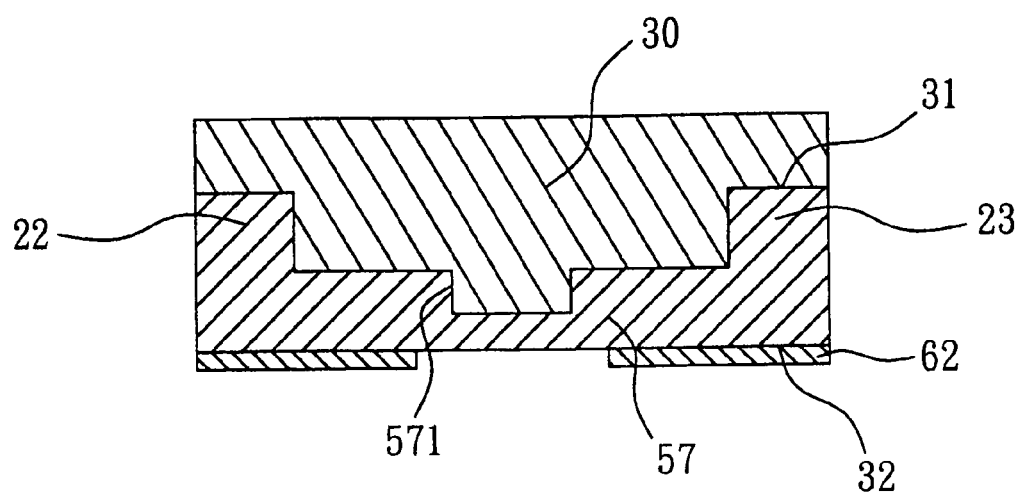
Figure 25:
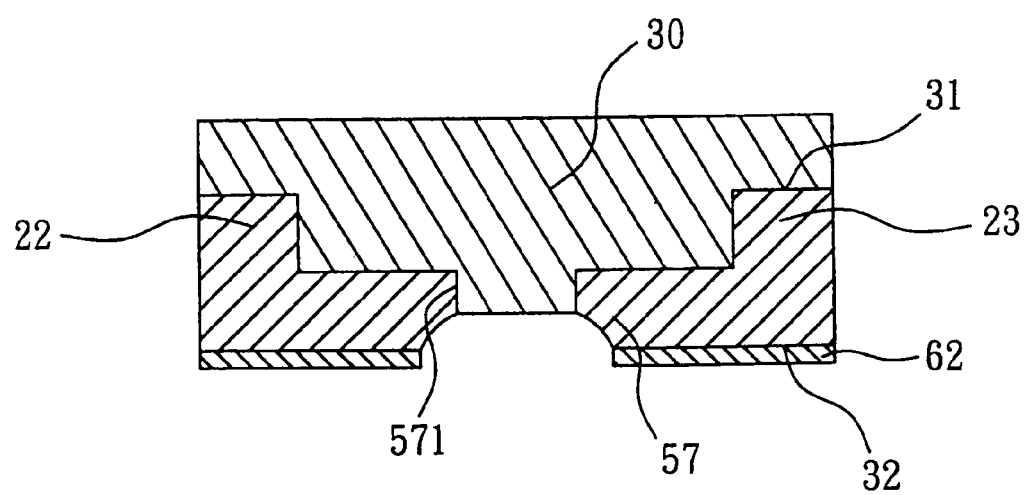
Figure 26:
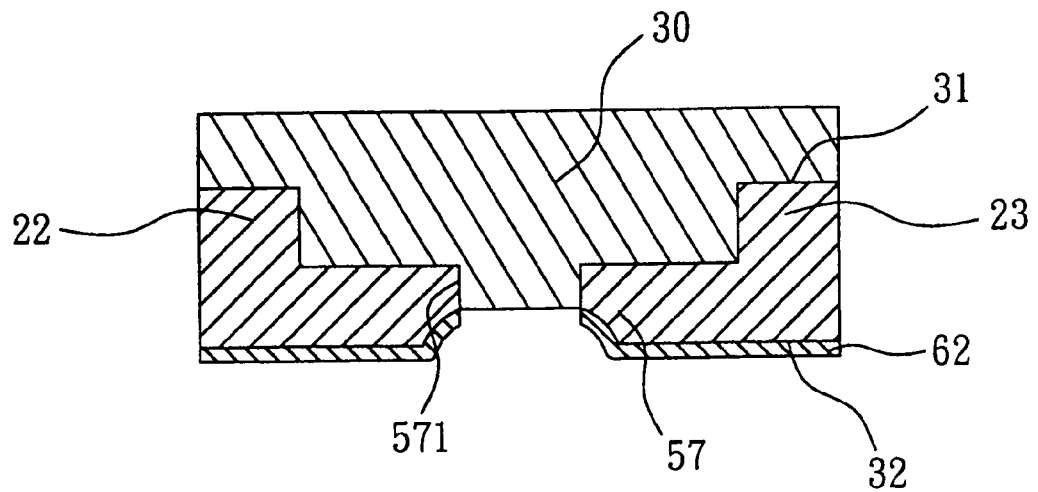

Referring to FIG. 23 to FIG. 26, they show the segregating step according to a fourth embodiment of the present invention. In the embodiment, the steps of providing a leadframe, die attaching, bonding and molding are the same as those of the third embodiment; however, there is difference in the step of segregating. In the embodiment, similarly, the connecting bar 57 is the same cut off at the bottom surface by etching. The etching method of the embodiment is described as follows. Firstly, referring to FIG. 23, the bottom surface of the connecting bar 57 is plated to form a plating layer 62, wherein the plating layer 62 does not fully cover the bottom surface of the connecting bar 57 so as to expose part of the connecting bar 57. It is to be understood that the plating step may be performed after the step S201 in FIG. 2, i.e. the bottom surface of the leadframe has a plating layer 62 in the beginning. FIG. 24 shows the molding step. Referring to FIG. 25, the exposed part of the connecting bar 57 is etched to be completely cut off to form a cavity. It should be noted that the etching step must be performed after the molding step. Finally, the cavity of the bottom surface of the connecting bar 57 is plated, as shown in FIG. 26, and the segregating step is therefore performed.

Figure 27:
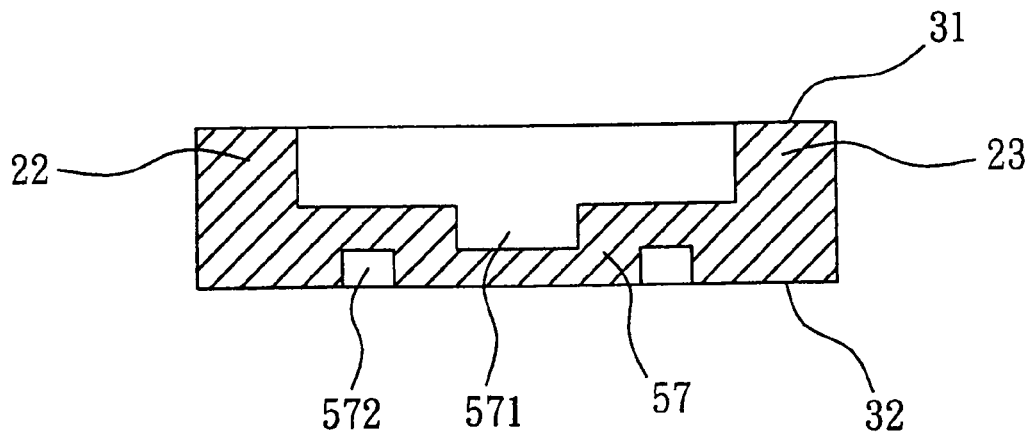
FIG. 27 shows a partial sectional view of die paddle region of the leadframe according to a fifth embodiment of the present invention.

Referring to FIG. 27, it shows a sectional view of die paddle region of the leadframe according to a fifth embodiment of the present invention. In the fifth embodiment, the type of the connecting bars 57, 59 in the die paddle region is different from the third embodiment. In the embodiment, taking the connecting bars 57 for an example, at least one top cavity 571 is preformed on the top surface of the connecting bar 57 and two bottom cavities 572 are performed on the bottom surface of the connecting bar 57 because the connecting bar 57 is to be finally cut off, i.e. the top surface of the connecting bar 57 have already had the top cavity 571 and the bottom surface of the connecting bar 57 have already had the bottom cavities 572 in the step S201 in FIG. 2. Wherein the bottom cavities 572 disconnects from the top cavity 571.

Figure 28:
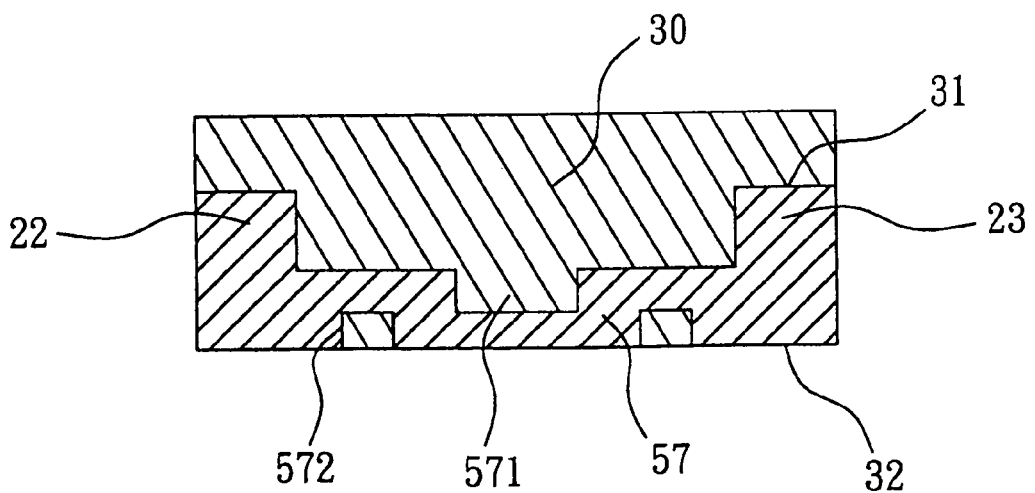
FIG. 28 shows the molding step according to the fifth embodiment of the present invention.

Afterwards, steps of attaching die and bonding are the same as the third embodiment. The step S204 is a molding step. A molding compound 30 is formed to encapsulating the dice 24, 25, 26 on surfaces of the die paddles 21, 22, 23, and exposing the bottom surface of the connecting bar 57 outside the molding compound 30, as shown in FIG. 28. Furthermore, the top cavity 571 and the bottom cavities 572 are filled up with the molding compound 30.

Figure 29:
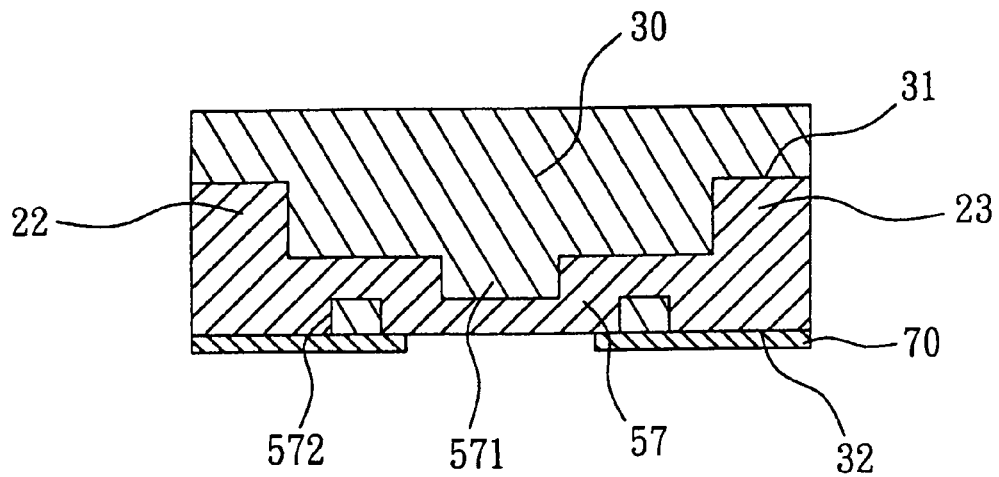
FIGS. 29 to 32 show the segregating step according to the fifth embodiment of the present invention.
Figure 30:
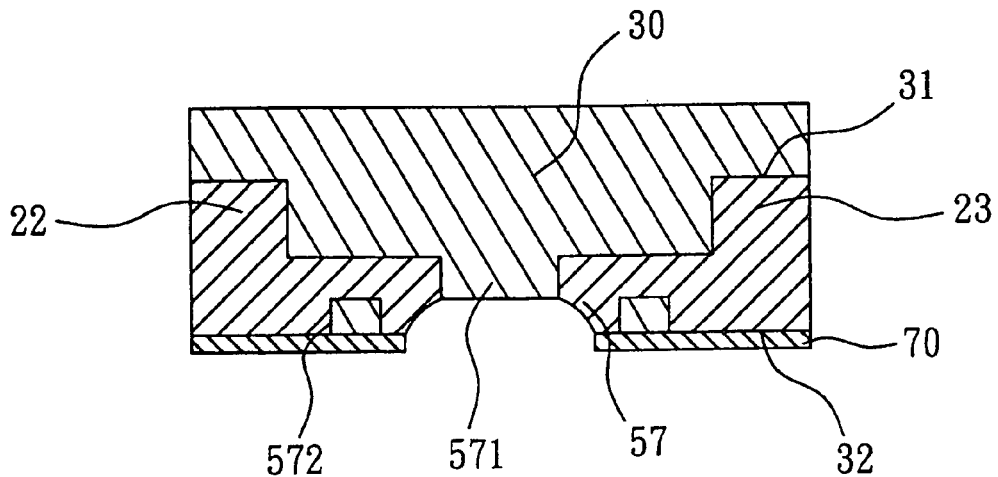
Figure 31:
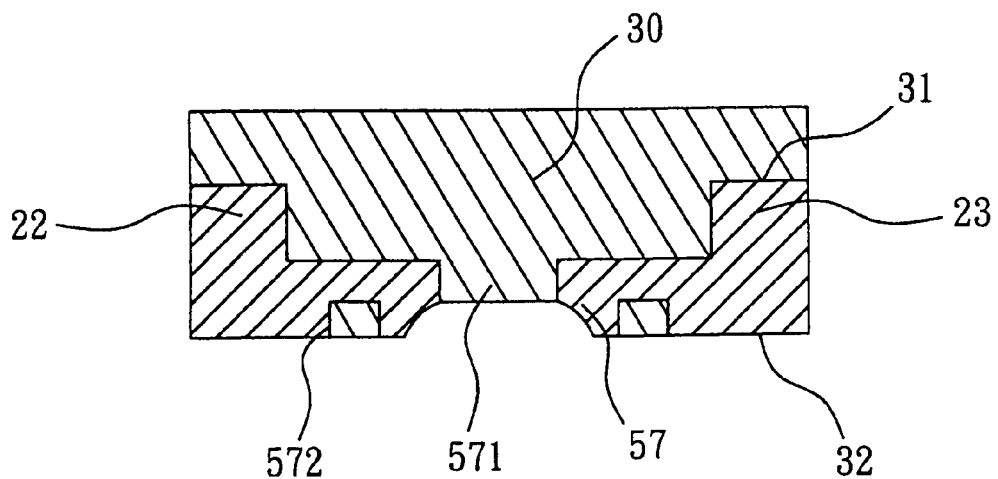
Figure 32:
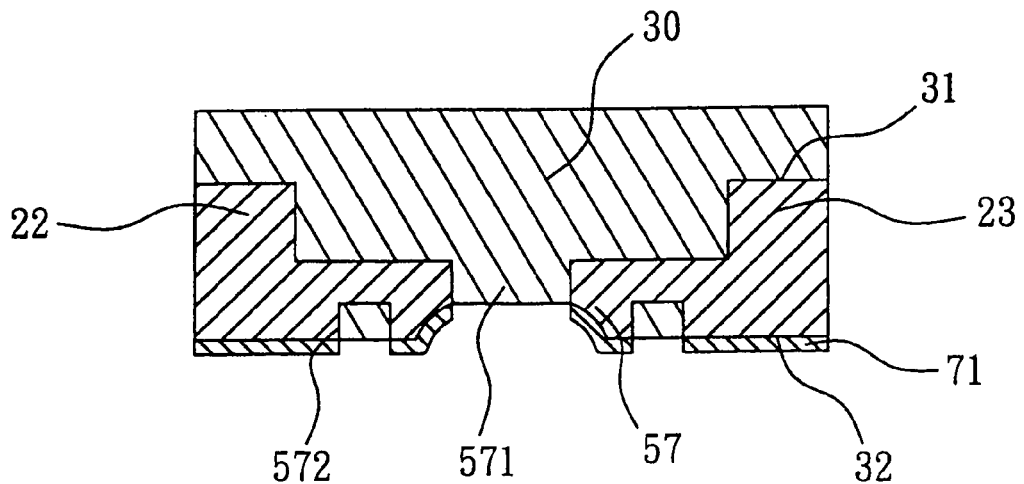
Figure 33:
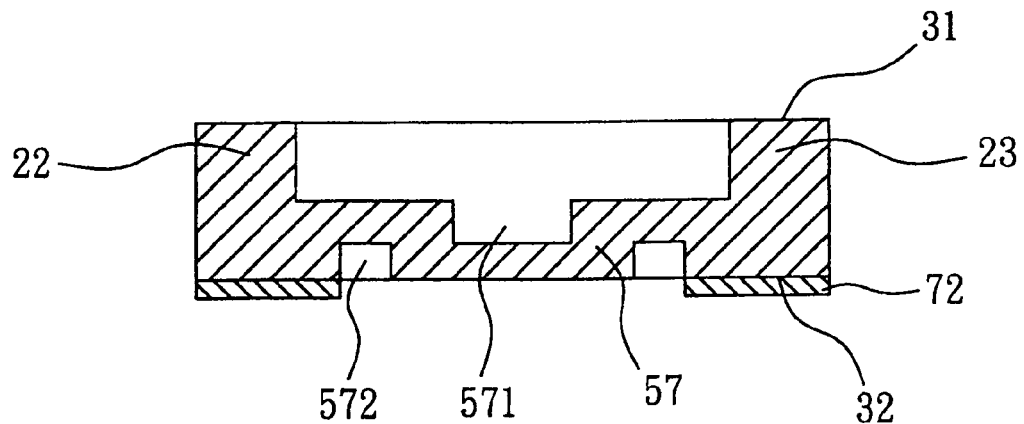
FIGS. 33 to 36 show the segregating step according to a sixth embodiment of the present invention.

Finally, the step S205 in FIG. 2 is a segregating step. In the step, part of the connecting bar 57 is removed to segregate the die paddles 21, 22, 23. Perfectly, the connecting bar 57 is totally removed. In the embodiment, the connecting bar 57 is to be cut off at the bottom surface by etching method. The etching method of the embodiment is described as follows. Firstly, referring to FIG. 29, a photo resist layer 70 is formed under the connecting bar 57, wherein the photo resist layer 70 covers the bottom cavities 572 but does not fully cover the bottom surface of the connecting bar 57 so as to expose part of the connecting bar 57. Referring to FIG. 30, the part of the connecting bar 57 is etched to be completely cut off. Referring to FIG. 31, the photo resist layer 70 is removed. Finally, the bottom surface of the connecting bar 57 is plated to form a plating layer 72, as shown in FIG. 32, and the segregating step is therefore performed.

Figure 34:
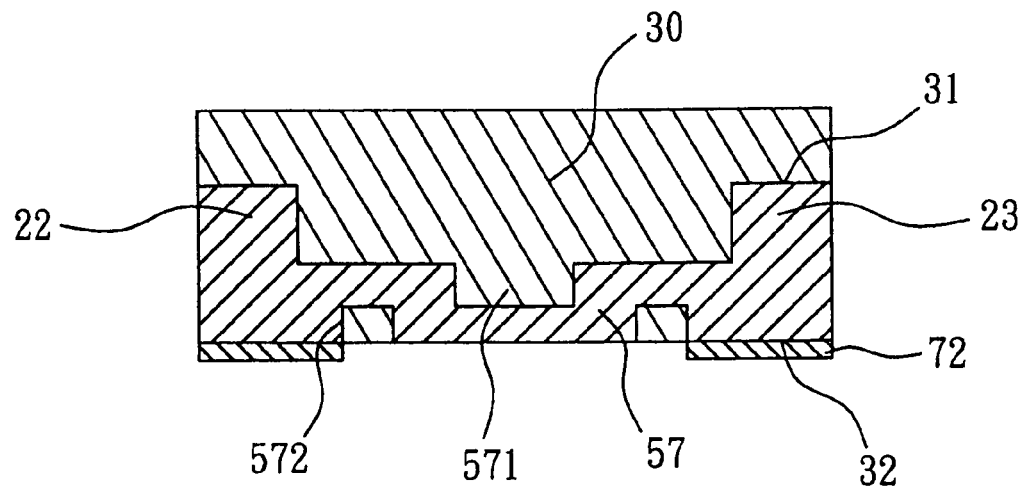
Figure 35:
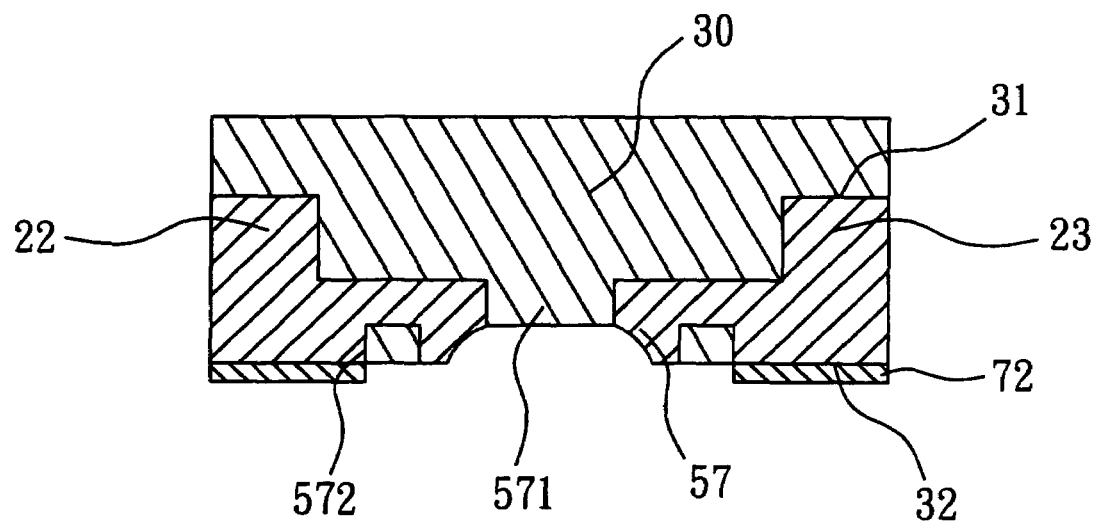
Figure 36:
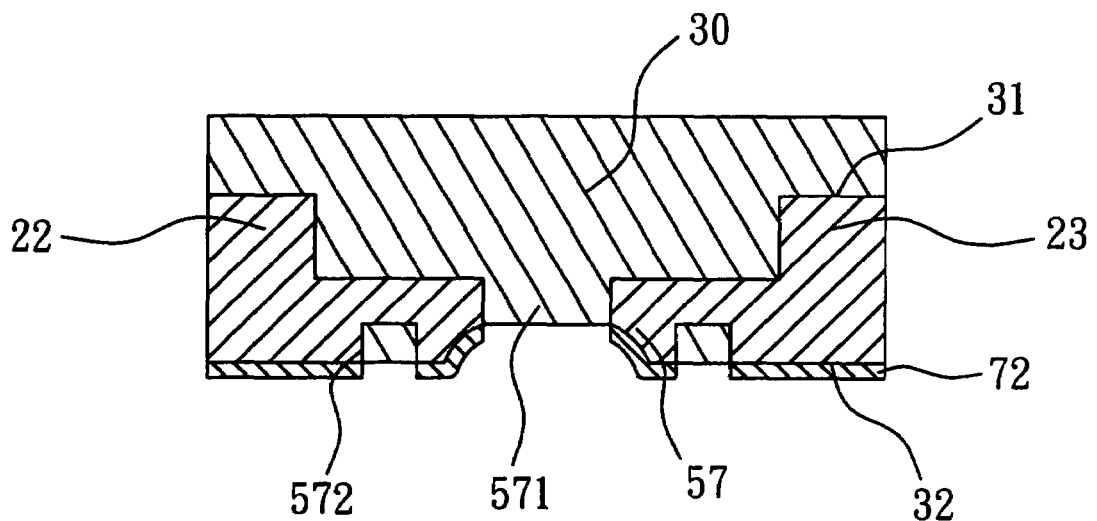

Referring to FIG. 33 to FIG. 36, they show the segregating step according to a sixth embodiment of the present invention. In the embodiment, the steps of providing a leadframe, die attaching, bonding and molding are the same as those of the fifth embodiment; however, there is difference in the segregating step. In the embodiment, the connecting bar 57 is the same cut off at the bottom surface by etching method. The etching method of the embodiment is described as follows. Firstly, referring to FIG. 33, the bottom surface of the connecting bar 57 is plated to form a plating layer 72, wherein the plating layer 72 does not fully cover the bottom surface of the connecting bar 57 so as to expose part of the connecting bar 57 and the bottom cavities 572. It is to be understood that the plating step may be performed after the step S201 in FIG. 2, i.e. the bottom surface of the leadframe has a plating layer 72 in the beginning. FIG. 34 shows the molding step. Referring to FIG. 35, the exposed part of the connecting bar 57 is etched to be completely cut off to form a cavity. It should be noted that the etching step must be performed after the molding step. Finally, the cavity of the bottom surface of the connecting bar 57 is plated, as shown in FIG. 36, and the segregating step is therefore performed.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A packaging method for segregating die paddles of a leadframe, the method comprising the steps of:
   (a) providing a leadframe having a top surface, a bottom surface and a die paddle region, the die paddle region having a plurality of die paddles, at least two of the die paddles connected to each other by a connecting bar;
   (b) attaching a plurality of dies onto the die paddles;
   (c) forming a molding compound to encapsulate the dies on the die paddles and to expose a bottom surface of the connecting bar outside the molding compound; and
   (d) removing part of the connecting bar so as to segregate the connected die paddles.

2. The method according to claim 1, wherein a thickness of the connecting bar is thinner than a thickness of the die paddles in the step (a).

3. The method according to claim 1, wherein a top surface of the connecting bar has at least one top cavity in the step (a).

4. The method according to claim 3, wherein the step (d) comprises the steps of:
   (d1) forming a photo resist layer on the bottom surface of the connecting bar to expose part of the connecting bar;
   (d2) etching the exposed part of the connecting bar to cut off the part of the connecting bar corresponding to the top cavity;
   (d3) removing the photo resist layer; and
   (d4) plating the bottom surface of the connecting bar.

5. The method according to claim 3, wherein the step (d) comprises the steps of:
   (d1) plating the bottom surface of the connecting bar to expose part of the connecting bar;
   (d2) etching the exposed part of the connecting bar to cut off the part of the connecting bar corresponding to the top cavity; and
   (d3) plating the etched bottom surface of the connecting bar.

6. The method according to claim 3, wherein the bottom surface of the leadframe has a plating layer, and part of the connecting bar is exposed outside the plating layer in the step (a), and the step (d) comprises the steps of:
   (d1) etching the exposed part of the connecting bar to cut off the part of the connecting bar corresponding to the top cavity; and
   (d2) plating the bottom surface of the connecting bar.

7. The method according to claim 3, wherein the bottom surface of the connecting bar has at least one bottom cavity in the step (a).

8. The method according to claim 7, wherein the step (d) comprises the following steps:
   (d1) forming a photo resist layer on the bottom surface of the connecting bar to expose part of the connecting bar;
   (d2) etching the exposed part of the connecting bar to cut off the part of the connecting bar corresponding to the top cavity;
   (d3) removing the photo resist layer; and
   (d4) plating the bottom surface of the connecting bar.

9. The method according to claim 8, wherein the photo resist layer covers the bottom cavity in the step (d1).

10. The method according to claim 7, wherein the step (d) comprises the steps of:
   (d1) plating the bottom surface of the connecting bar to expose part of the connecting bar;
   (d2) etching the exposed part of the connecting bar to cut off the part of the connecting bar corresponding to the top cavity; and
   (d3) plating the etched bottom surface of the connecting bar.

11. The method according to claim 10, further comprising a step for exposing the bottom cavity in the step (d1).

12. The method according to claim 7, wherein the bottom surface of the leadframe has a plating layer, and part of the connecting bar is exposed outside the plating layer in the step (a), and the step (d) comprises the steps of:
   (d1) etching the exposed part of the connecting bar to cut off the part of the connecting bar corresponding to the top cavity; and
   (d2) plating the bottom surface of the connecting bar.

13. The method according to claim 1, wherein the bottom surface of the connecting bar has at least one bottom cavity in the step (a).

14. The method according to claim 1, further comprising a step for forming a plurality of conducting wires after the step (b).

15. The method according to claim 1, wherein the connecting bar is cut off from the bottom surface of the connecting bar in the step (d).

16. The method according to claim 1, wherein part of the connecting bar is removed by etching in the step (d).

17. The method according to claim 1, wherein the connecting bar is totally removed in the step (d).

18. The method according to claim 1, wherein the step (d) comprises the steps of:
   (d1) forming a photo resist layer on the bottom surface of the connecting bar to expose part of the connecting bar;
   (d2) etching the exposed part of the connecting bar to cut it off;
   (d3) removing the photo resist layer; and
   (d4) plating the bottom surface of the connecting bar.

19. The method according to claim 1, wherein the step (d) comprises the steps of:
   (d1) plating the bottom surface of the connecting bar to expose part of the connecting bar;
   (d2) etching the exposed part of the connecting bar to cut it off; and
   (d3) plating the etched bottom surface of the connecting bar.

20. The method according to claim 1, wherein the bottom surface of the leadframe has a plating layer, and part of the connecting bar is exposed outside the plating layer in the step (a), and the step (d) comprises the steps of:
   (d1) etching the exposed part of the connecting bar to cut it off; and
   (d2) plating the bottom surface of the connecting bar.

* * * * *